United States Patent [19]

Aiko

[11] Patent Number: 4,622,537
[45] Date of Patent: Nov. 11, 1986

[54] PREDICTIVE CODE CONVERSION METHOD CAPABLE OF FORCIBLY PUTTING A FEEDBACK LOOP IN AN INACTIVE STATE

[75] Inventor: Shinichi Aiko, Tokyo, Japan

[73] Assignee: NEC Corporation, Tokyo, Japan

[21] Appl. No.: 635,032

[22] Filed: Jul. 27, 1984

[30] Foreign Application Priority Data

Jul. 29, 1983 [JP] Japan ................................. 58-13902

[51] Int. Cl.⁴ ........................................... H03M 1/12
[52] U.S. Cl. .............................. 340/347 DD; 375/25
[58] Field of Search .................... 340/347 DD; 375/27

[56] References Cited

U.S. PATENT DOCUMENTS 4,437,087  3/1984  Petr ............................. 340/347 DD
4,475,227 10/1984  Belfield ................................ 381/30

Primary Examiner—William M. Shoop, Jr.
Assistant Examiner—Saul M. Bergmann
Attorney, Agent, or Firm—Sughrue, Mion, Zinn, Macpeak & Seas

[57] ABSTRACT

In a predictive encoder for encoding an encoder input signal into an encoder output signal and having in a feedback loop an adaptive predictive filter which comprises a plurality of taps assigned with adaptive prediction coefficients and produces a predictive signal predictive of the encoder input signal, an encoder control circuit monitors products between the coefficients and tap signals derived from the taps so as to force each product to zero when an absolute value of each product is not greater than a predetermined value. The feedback loop is temporarily placed in an inactive state when the predictive signal becomes zero as a result of all zeros of the products. A predictive decoder is also operated by the use of a decoder control circuit similar to the encoder control circuit and cooperating with an adaptive predictive filter of the decoder. Each adaptive predictive filter may be either of an FIR type or of an IIR type.

5 Claims, 5 Drawing Figures

PREDICTIVE CODE CONVERSION METHOD CAPABLE OF FORCIBLY PUTTING A FEEDBACK LOOP IN AN INACTIVE STATE

BACKGROUND OF THE INVENTION

This invention relates to a method of carrying out conversion between first signal sequence and second signal sequence in a differential pulse code modulation (DPCM) system and to an encoder and a decoder for use in carrying out the conversion. Mor particularly, this invention is applicable to an adaptive differential pulse code modulation (ADPCM) system. It is to be noted here that the conversion method may be an encoding method and/or a decoding method and that the encoder encodes the first signal sequence into the second signal sequence while the decoder decodes the second signal sequence into the first signal sequence.

As will later be described with reference to a few figures of the accompanying drawing, a conventional conversion method is described by Takao Nishitani et al in ICASSP 82 Proceedings, Volume 2 (May 1982), pages 960–963, under the title of "A 32 kb/s Toll Quality ADPCM Codec using a Single Chip Signal Processor." In the conventional conversion method, adaptive prediction is carried out in each of an encoder and a decoder by the use of an adaptive predictor so as to successively predict a current or predictive signal from preceding or past signals. The encoder encodes a first signal sequence with reference to the predictive signals into a second signal sequence which is produced in the form of predictive error signals between the first signal sequence and the predictive signals. On the other hand, the decoder reproduces the first signal sequence in response to the received second signal sequence with reference to the predictive signals derived from the received second signal sequence. Each predictive signal is adaptively varied in accordance with an input signal supplied to each predictor, so as to enable precise prediction.

As known in the art, the conversion method is very effective because electric power of the second electric signal sequence can be reduced as compared with that of the first signal sequence, when the first signal sequence carries a signal, such as an audio signal, having a strong correlation.

It should be noted here that operation of the encoder continues to be subject to the influence of the initial state for a long time after the beginning of operation. This is because the encoder has a feedback loop that includes the predictor. As a result, encoding precision or quality of the second signal succession is often degraded due to this dependence on the initial state. Moreover, the encoding quality may vary from one operation to another if the initial state of the encoder is different at the beginning of one operation from that at the beginning of the previous operation.

Such variation of the encoding quality adversely affects decoding operation of the decoder.

SUMMARY OF THE INVENTION

It is an object of the this invention to provide a method of carrying out conversion between two signal sequences by the use of an adaptive predictor, wherein an influence of an initial state can instantly be removed.

It is another object of this invention to provide a method of the type described, which can avoid degradation of encoding quality.

It is a further object of this invention to provide a predictive encoder which is for use in such method and which can instantly remove an influence resulting from variation of initial states thereof.

It is another object of this invention to provide a predictive decoder which is communicable with the above-mentioned encoder.

According to this invention, a method is provided for carrying out conversion between a sequence of first signals and a sequence of second signals by the use of an adaptive predictor which is responsive to the second signal sequence to produce a sequence of predictive signals predictive of the first signals, respectively. The adaptive predictor comprises tap signal producing means having a plurality of taps assigned with prediction coefficients, respectively, for producing a plurality of tap signals in response to the second signal sequence, respectively, coefficient signal producing means for adaptively producing a plurality of coefficient signals representative of the prediction coefficients, respectively, a plurality of multipliers responsive to the tap signals and the coefficient signals for calculating products therebetween to produce product signals representative of the products, respectively, and output means responsive to the product signals for producing the predictive signal sequence. The method comprises the step of monitoring the products to render each of the products zero when the each product is not greater than a predetermined value.

DESCRIPTION OF THE PREFERRED EMBODIMENTS

Figure 1:
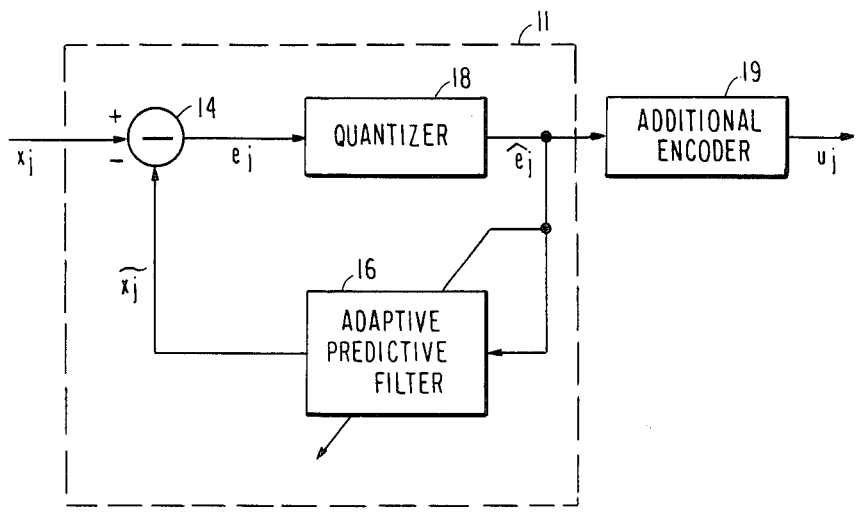
FIG. 1 is a block diagram of a conventional encoding device.
Figure 2:
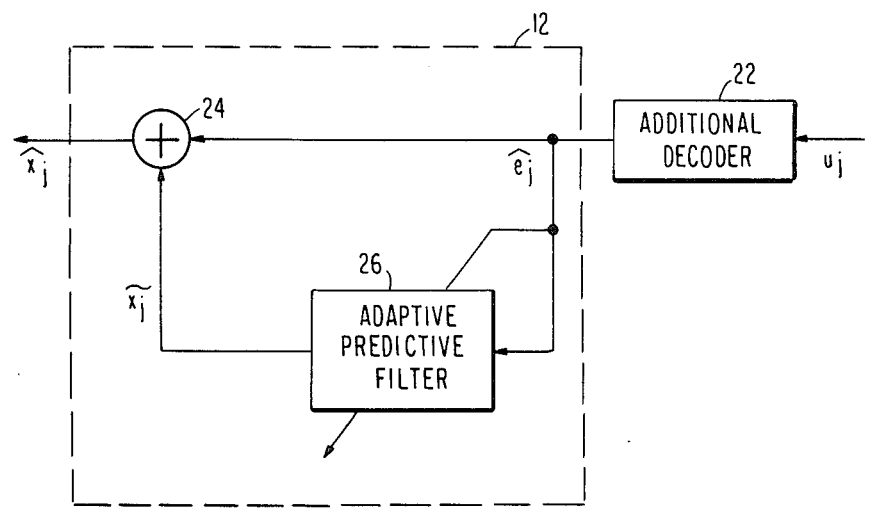
FIG. 2 is a block diagram of a conventional decoding device operable in cooperation with the encoding device illustrated in FIG. 1.

Referring to FIGS. 1 and 2, a conventional adaptive differential pulse code modulation (ADPCM) system will be described at first for a better understanding of this invention. The system comprises an encoding device and a decoding device which are illustrated in FIGS. 1 and 2, respectively, and which are exemplified by a predictive encoder 11 and a predictive decoder 12, respectively. The predictive encoder and decoder 11 and 12 may be called ADPCM encoder and decoder, respectively. In FIG. 1, the encoder 11 is supplied with a sequence of first digital signals x which may be referred to as a sequence of encoder input signals, although only a current one of the first digital signals at a current time instant j is represented by $x_j$ in FIG. 1. Similar representation will be used in connection with any other signals, though not explicitly described for each signal. A subtractor 14 subtracts a local output signal $\bar{x}_j$ of an adaptive predictive filter 16 from the first digital signal $x_j$ to produce an error signal $e_j$ representative of a difference between the encoder input signal $x_j$ and the local output signal $\tilde{x}_j$. The error signal $e_j$ may be called a predictive error signal, as will become clear as the description proceeds. The adaptive predictive filter 16 may be referred to as an encoder predictor.

The predictive error signal $e_j$ is quantized by a quantizer 18 into a quantized predictive error signal $\hat{e}_j$ in a well-known manner. The quantized predictive error signal $\hat{e}_j$ is delivered as an encoder output signal to an additional encoder 19 which follows the encoder 11. A sequence of the encoder output signals may be termed a sequence of second digital signals and is subjected to variable length encoding or the like in the additional encoder 19 to be delivered as a differential pulse code modulation (DPCM) signal $U_j$ to a transmission line (not shown).

On the other hand, the quantized predictive error signal $\hat{e}_j$ is also delivered from the quantizer 18 to the adaptive predictive filter 16. In the manner well known in the art, the adaptive predictive filter 16 is provided with a plurality of prediction coefficients which are adaptively modified in accordance with the quantized predictive error signal $\hat{e}_j$. Moreover, the adaptive predictive filter 16 produces a sequence of signals predictive of the encoder input signal succession x with reference to the adaptively modified prediction coefficients. More specifically, when supplied with the quantized predictive error signal $\hat{e}_j$ at the current time instant j, the adaptive predictive filter 16 produces a current one ($\tilde{x}_j$) of the predictive signals that is predictive of the current encoder input signal $x_j$ and calculates the following predictive signal $\tilde{x}_{j+1}$ at the following time instant (j+1). At any rate, each predictive signal is sent to the subtractor 14 as each local output signal.

As shown in FIG. 1, the encoder 11 forms a feedback system comprising the adaptive predictive filter 16 in a feedback loop. The prediction coefficients of the adaptive predictive filter 16 are adaptively modified in response to the quantized predictive error signal $\hat{e}_j$. This implies that the feedback system is not readily placed in a stable state. Therefore, when the encoder 11 begins to operate by supply of electric power, the operation is subject to the influence of an initial state at the beginning of the operation. The influence of the initial state lasts for a long time in the feedback loop. This gives rise to a variation of encoding quality dependent on the differences encountered in the initial state.

In FIG. 2, the conventional decoder 12 is preceded by an additional decoder 22 supplied with a reception signal through a transmission line (not shown). The reception signal is equivalent to the DPCM signal $U_j$ (FIG. 1) if no error takes place in the DPCM signal during transmission and is therefore denoted as $U_j$, like the DPCM signal. The reception signal $U_j$ is decoded by the additional decoder 22 into a reproduced error signal which is a reproduction of the quantized predictive error signal $\hat{e}_j$ (FIG. 1) and which is therefore designated by the same reference symbol as the quantized predictive error signal $\hat{e}_j$. The reproduced error signal $\hat{e}_j$ thus corresponds to the quantized predictive error signal $\hat{e}_j$ and may therefore be called the second digital signal like in the quantized predictive error signal $\hat{e}_j$.

The reproduced error signal $\hat{e}_j$ is given to the decoder 12 as a decoder input signal and is delivered to an adder 24 and an adaptive predictive filter 26 which may be referred to as a decoder predictor. The decoder predictor 26 produces a reproduced pedictive signal $\tilde{x}_j$ at a current time instant j. The reproduced predictive signal $\tilde{x}_j$ is added to the reproduced error signal $\hat{e}_j$ by the adder 24 to be produced as a reproduced signal $\bar{x}_j$ which is a reproduction of the encoder input signal $x_j$ (FIG. 1). The reproduced signal $\bar{x}_j$ may be called the first digital signal like the encoder input signal $x_j$ and appears as a decoder output signal.

Responsive to the reproduced error signal $\hat{e}_j$ at the current time instant j, the decoder predictor 26 adaptively modifies prediction coefficients assigned thereto to calculate the next following reproduced predictive signal $\tilde{x}_{j+1}$ for the next subsequent time instant (j+1).

Operation of the decoder 12 is dependent on that of the encoder 11. Accordingly, the decoder 12 is also subjected to the influence of the initial state of the encoder 11. As a result, similar problem arises as regards the decoder 12.

It will be assumed that predictive encoding and decoding as mentioned above are often repeated a number of times through a plurality of sets, each comprising adaptive predictive encoder and decoder. In this case, initial internal states of each set may be different from those of the other sets. Under the circumstances, degradation of the encoding quality is accumulated at every set and becomes a serious problem.

Figure 3:
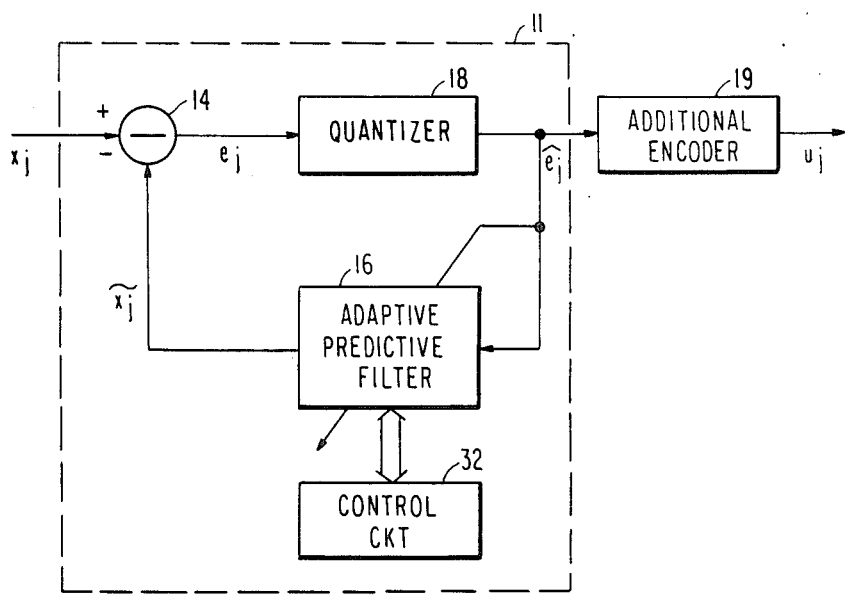
FIG. 3 is a block diagram of an encoding device according to a preferred embodiment of this invention.

Referring to FIG. 3, an encoding device according to a preferred embodiment of this invention is applicable to the ADPCM system and comprises similar parts and deals with signals, all of which will be designated by like reference numerals and symbols. The illustrated encoder 11 is similar to that illustrated in FIG. 1 except that an encoder control circuit 32 is coupled to the adaptive predictive filter 16. It should be noted here that the influence of the initial state can be removed by putting the adaptive predictive filter 16, namely, the feedback loop into a transient inactive state. For this purpose, the encoder control circuit 32 monitors the encoder predictor 16 in a manner to be described later.

In FIG. 3, the encoder 11 encodes the encoder input signal $x_j$ into the quantized predictive error signal $\hat{e}_j$ supplied as the encoder output signal to the additional encoder 19. The encoder output signal is subjected to another encoding in the additional encoder 19 to be sent as the DPCM signal $U_j$ to a transmission line (not shown).

Figure 4:
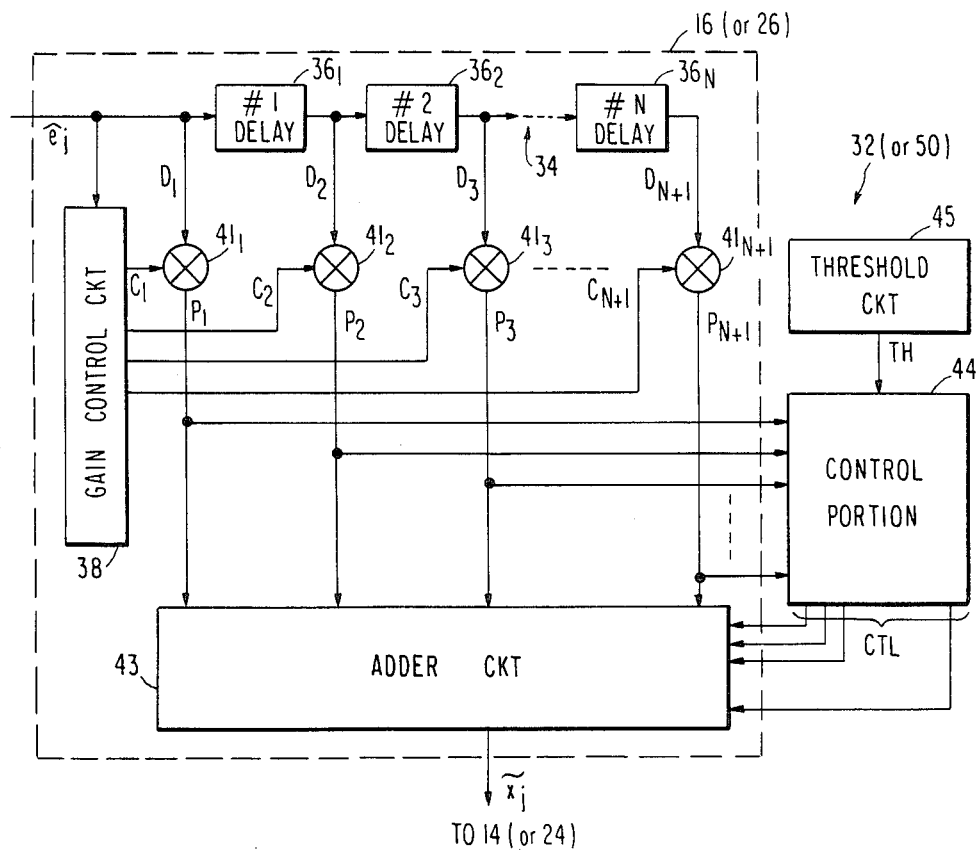
FIG. 4 is a block diagram of a part of the encoding device illustrated in FIG. 3.

Referring to FIG. 4 together with FIG. 3, the illustrated adaptive predictive filter 16 is of a Finite Impulse Response (FIR) type and comprises a delay circuit 34 comprising first through (N+1)-th taps and first through N-th delay units $36_1$ to $36_N$ each of which is connected between two adjacent ones of the taps, where N is representative of a natural number of, for example, ten. The quantized predictive error signal $\hat{e}_j$ is successively delayed by the first through the N-th delay units $36_1$ to $36_N$ and appears as first through (N+1)-th tap signals $D_1$ to $D_{N+1}$ through the first through the (N+1)-th taps, respectively. Therefore, the delay circuit 34 may be named a tap signal producing circuit.

The quantized predictive error signal $\hat{e}_j$ is supplied to a gain control circuit 38 for producing first through (N+1)-th coefficient signals $C_1$ to $C_{N+1}$ representative of first through (N+1)-th prediction coefficients, respectively. The first through the (N+1)-th prediction coefficients are assigned to the first through the (N+1)-th taps, respectively, and are adaptively modified under control of the gain control circuit 38 in response to the quantized predictive error signal $\hat{e}_j$. As a result, the first through the (N+1)-th coefficient signals $C_1$ to $C_{N+1}$ are modified in accordance with the quantized predictive error signal $e_j$. The first through the (N+1)-th coefficient signals $C_1$ to $C_{N+1}$ are in one-to-one correspondence to the first through the (N+1)-th tap signals $D_1$ to $D_{N+1}$, respectively.

First through (N+1)-th multipliers $41_1$ to $41_{N+1}$ multiply the first through the (N+1)-th tap signals $D_1$ to $D_{N+1}$ by the first through the (N+1)-th coefficient signals $C_1$ to $C_{N+1}$ to calculate first through (N+1)-th products, respectively. The first through the (N+1)-th products are delivered as first through (N+1)-th product signals to an adder circuit 43, respectively. An i-th one of the first through the (N+1)-th product signals $P_1$ to $P_{N+1}$ can be represented by:

$$P_i = C_i \times D_i.$$

Thus, each product can be specified by a prescribed number of values between a maximum and a minimum value, both inclusive.

The adder circuit 43 sums up the first through the (N+1)-th products $P_1$ to $P_{N+1}$ and produces the predictive signal $x_j$ given by:

$$\tilde{x}_j = \sum_{i=1}^{N+1} C_i \times D_i.$$

If an audio or speech signal is carried by the encoder input signal sequence x, a pause or a quiescent state inevitably occurs in the encoder input signal succession x. Under the circumstances, each of the first through the (N+1)-th products becomes small during the quiescent state but the predictive signal $\tilde{x}_j$ does not go to zero.

More particularly, let each of the tap signals $D_i$ and the coefficient signals $C_i$ have a predetermined length of, for example, four bits. In this event, each product signal $P_i$ can be expressed by eight bits. Each product $P_i$ becomes zero when either the tap signal $D_i$ or the coefficient signal $C_i$ becomes equal to zero. In order to render the feedback loop into the inactive state, all of the first through the (N+1)-th product signals $P_1$ to $P_{N+1}$ should be rendered zero. However, the first through the (N+1)-th product signals $P_1$ to $P_{N+1}$ are not readily rendered zero at the same time during the quiescent state of the encoder input signal sequence x. Thus, the feedback loop is not readily put into the inactive state.

In FIG. 4, the illustrated control circuit 32 comprises a control portion 44 supplied with the first through the (N+1)-th product signals $P_1$ to $P_{N+1}$ and a threshold circuit 45 for producing a threshold signal TH representative of a threshold value. The control portion 44 monitors the first through the (N+1)-th product signals $P_1$ to $P_{N+1}$ with reference to the threshold signal TH. More specifically, if the value of each product $P_i$ is smaller than the threshold value, the control portion 44 forces the value of each product to zero. Consequently, it is possible to put the adaptive predictive filter 16 into the inactive state by rendering all of the products zero during the quiescent state. For this purpose, the control portion 44 supplies the adder circuit 43 with control signals CTL representative of results of monitoring. Production of the control signals CTL can be possible by the use of usual comparators. The control signals CTL are used in the adder circuit 43 to individually gate the first through the (N+1)-th product signals $P_1$ to $P_{N+1}$, respectively. Therefore, the adder circuit 43 may be a combination of gate circuits and an adder.

As mentioned above, the adaptive predictive filter 16 renders the predictive signal $\tilde{x}_j$ zero during the quiescent state. As a result, the feedback loop is transiently put into the inactive state and the influence of initial state can be removed by shutting off the feedback loop in effect.

Operation of the control circuit 32 will be described more in detail. Let each of the coefficient signals $C_i$ and the tap signals $D_i$ have a predetermined length of, for example, four bits. In this event, each product signal $P_i$ can be expressed by eight bits and therefore divisible into a higher significant part of four bits and a lower significant part of four bits. In addition, let each product be expressed by a fixed point representation and the higher significant part alone be produced from each multiplier as each product signal $P_i$ with the lower significant part truncated.

If $C_i$ and $D_i$ are equal to "0011" and "0001," the product becomes equal to "0000." Therefore, the threshold value may be equal to "0000."

On the other hand, it will be assumed that each tap signal $D_i$ is represented in the notation of two's complement. If the tap signal $D_i$ is equal to minus 0001, the tap signal $D_i$ is represented as "1111" in the two's complement notation. As a result, the product is rendered into "1111" which corresponds to the decimal number −1, not zero. When each product can take a negative value, such as −1, the product signal $P_i$ cannot become zero. As a result, the predictive signal $\tilde{x}_j$ also cannot become equal to zero despite the fact that each product is very small. In this event, the predictive signal $\tilde{x}_j$ can become equal to zero by giving the threshold circuit 45 the threshold value of "1111" and by rendering each product signal $P_i$ forcibly zero when each product is equal to or less than "1111." In this example, each product signal $P_i$ is rendered zero only when each product takes "1111." Thus, an absolute value of each product may be monitored by the control circuit 32.

Likewise, each product signal $P_i$ does not become zero during the quiescent state when the length of each product signal $P_i$ is too long. In this event, the control circuit 32 may monitor an absolute value of each product and renders the absolute value zero when the absolute value is equal to or smaller than the threshold value predetermined for each product.

The feedback loop, namely, the adaptive predictive filter 16 can be put into the inactive state during the quiescent state by the use of the control circuit 32.

Figure 5:
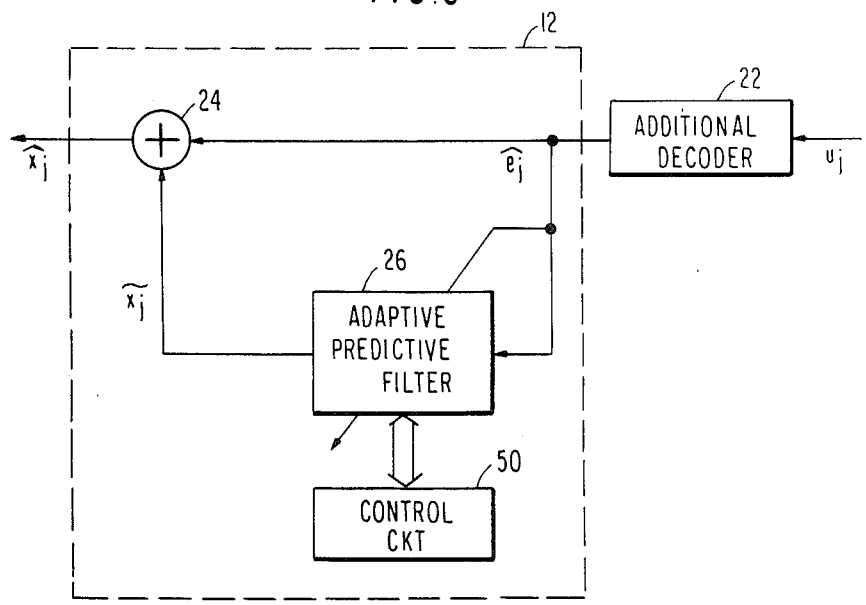
FIG. 5 is a block diagram of a decoding device which is operable in cooperation with the encoding device illustrated in FIG. 3.

Referring to FIG. 5, a decoding device is operable in cooperation with the encoding device described in conjunction with FIGS. 3 and 4 and is similar to that illustrated in FIG. 2 except that the decoder predictor 26 included in the decoder 12 is coupled to a decoder control circuit 50 which may be called a decoder control circuit. In this connection, the control circuit 32 (FIG. 3) may be named an encoder control circuit. The decoder control circuit 50 is similar in structure and operation to the encoder control circuit 32 illustrated in FIG. 4 and therefore monitors each product signal $P_i$ to force each product to zero when the absolute value of each product is not greater than a threshold value which may be equal to that determined in the encoder control circuit 32.

While this invention has thus far been described in conjunction with a preferred embodiment thereof, it will readily be possible for those skilled in the art to put this invention into practice in various other forms. For example, each of the encoder and the decoder predictors 16 and 26 may be of an Infinite Impulse Response (IIR) type. In this event, each predictor 16 and 26 (FIG. 4) is supplied with a sum of the predictive signal $\bar{x}_j$ and the quantized predictive error signal $\tilde{e}_j$ through an additional adder, instead of the quantized predictive error signal $\tilde{e}_j$. Each of the decoder and the decoder predictors may be a combination of an IIR type and an FIR type.

What is claimed is:

1. A method for use in an adaptive differential pulse code modulation system to convert a selected one of first and second signal sequences into the other signal sequence by the use of an adaptive predictor which is responsive to said second signal sequence to produce a third signal sequence, predictive of said first signal sequence, said adaptive predictor comprising tap signal producing means having a plurality of taps assigned with prediction coefficients, respectively, for producing a plurality of tap signals in response to said second signal sequence, respectively, coefficient signal producing means for adaptively producing a plurality of coefficient signals representative of said prediction coefficients, respectively, a plurality of multipliers responsive to said tap signals and said coefficient signals for calculating products therebetween to product product signals representative of said products, respectively, and output means responsive to said product signals for producing said third signal sequence, said method comprising the step of:

monitoring said products to detect absence of said selected one of the first and second signal sequences;

comparing each os said products with a predetermined value to detect whether or not said each product is greater than said predetermined value and thereby to indicate absence of said selected one of the first and second signal sequences; and rendering said each product zero when said product is not greater than said predetermined value.

2. A method as claimed in claim 1, said method comprising an encoding step carried out in an encoder comprising said adaptive predictor as an encoder predictor, said encoding step being for encoding the first signal sequence given as an encoder input signal sequence into the second signal sequence produced as an encoder output signal sequence, wherein said encoding step comprises the steps of:

subtracting the third signal sequence to said encoder predictor from said encoder input signal sequence to produce said encoder output signal sequence;

delivering said encoder output signal sequence to said encoder predictor to make the multipliers of said encoder predictor produce the product signals monitored through said monitoring step of said encoder predictor; and making said encoder predictor produce the third signal sequence thereof in response to the monitored product signals given from the multipliers of said encoder predictor.

3. A method as claimed in claim 1, said method comprising a decoding step carried out in a decoder comprising said adaptive predictor as a decoder predictor, said decoding step being for decoding the second signal sequence given as a decoder input signal sequence into the first signal sequence produced as a decoder output signal sequence, wherein said decoding step comprises the steps of:

adding said decoder input signal sequence to the third signal sequence of said decoder predictor to produce said decoder output signal sequence;

delivering said decoder input signal sequence to said decoder predictor to make the multipliers of said decoder predictor produce the product signals monitored through the monitoring step of said decoder; and making said decoder predictor produce the third signal sequence in response to the monitored product signals given from the multipliers of said decoder predictor.

4. An encoder for carrying out the method of claim 1 by encoding said first signal sequence into said second signal sequence, wherein said encoder comprises:

encoder monitoring means coupled to said multipliers for monitoring said products to render each of said products zero when said each product is not greater than said predetermined value.

5. A decoder for carrying out the method of claim 1 by decoding said second signal sequence into said first signal sequence, wherein said decoder comprises:

decoder monitoring means coupled to said multipliers for monitoring said products to render each of said product zero when said each product is not greater than said predetermined value.

* * * * *

UNITED STATES PATENT AND TRADEMARK OFFICE
CERTIFICATE OF CORRECTION

PATENT NO. : 4,622,537

DATED : November 11, 1986

INVENTOR(S) : Shinichi Aiko

It is certified that error appears in the above-identified patent and that said Letters Patent is hereby corrected as shown below:

Column 5, line 1   Delete "$e_j$" and insert --$\hat{e}_j$--

Column 5, line 22   Delete "$X_j$" and insert --$\tilde{X}_j$--

Column 7, line 4   Delete "$\tilde{e}_j$" and insert --$\hat{e}_j$--

Column 7, line 6   Delete "$\tilde{e}_j$" and insert --$\hat{e}_j$--, and delete "decoder" and insert --encoder-- (first occurrence)

Column 7, line 25, Claim 1, Delete "product" and insert --produce-- (first occurrence).

Signed and Sealed this

Twenty-eighth Day of April, 1987

Attest:

DONALD J. QUIGG

Attesting Officer          Commissioner of Patents and Trademarks